United States Patent [19]

Murakami

[11] Patent Number: 4,706,374
[45] Date of Patent: Nov. 17, 1987

[54] METHOD OF MANUFACTURE FOR SEMICONDUCTOR ACCELEROMETER

[75] Inventor: Koichi Murakami, Yokosuka, Japan

[73] Assignee: Nissan Motor Co., Ltd., Yokohama, Japan

[21] Appl. No.: 780,933

[22] Filed: Sep. 27, 1985

[30] Foreign Application Priority Data

Oct. 19, 1984 [JP] Japan .............................. 59-218495

[51] Int. Cl.[4] ..................... H01L 21/467; H01L 29/84
[52] U.S. Cl. ..................................... 437/225; 357/26; 437/170; 437/921
[58] Field of Search ................. 29/569 R, 576 C, 580, 29/591; 148/175; 357/26, 55; 156/628, 648, 649, 656, 657

[56] References Cited

U.S. PATENT DOCUMENTS 4,549,427 10/1985 Kolesar et al. ........................ 73/23
4,597,003 6/1986 Aine et al. ............................ 357/26

FOREIGN PATENT DOCUMENTS 0138023 4/1985 European Pat. Off. .............. 357/26
0136977 8/1984 Japan ..................................... 357/26

OTHER PUBLICATIONS

Petersen et al., "Micromechanical Accelerometer . . . ," IEEE Transac. Electron Devices, V 29 (Jan. 1982) pp. 23-27.
Petersen, "Micromechanical voltage . . . ," Intl. Electron Devices Meeting (Dec. 4-6, 1978), pp. 100-103.
Sarro et al., "Silicon Cantilever Beams . . . ", J. Electrochem. Soc., Aug. 1986, pp. 1724-1729.
IEEE Electron Devices, "A Batch-Fabricated Silicon Accelerometer" vol. ED-26, No. 12, Dec. 1979, pp. 1911-1917.

Primary Examiner—Olik Chaudhuri
Attorney, Agent, or Firm—Schwartz, Jeffery, Schwaab, Mack, Blumenthal & Evans

[57] ABSTRACT

An improved method of manufacturing a semiconductor accelerometer having a cantilevered beam is shown. In the fabricating process a semiconductor substrate is divided into p-type regions and n-type regions. The substrate is immersed into an electrochemical solution with a cathode and a suitable voltage is applied. Certain portions of the substate are protected from the etching by the voltage such that the semiconductor substrate is etched to form the cantilevered beam.

9 Claims, 32 Drawing Figures

PRIOR ART Fig.1(A)
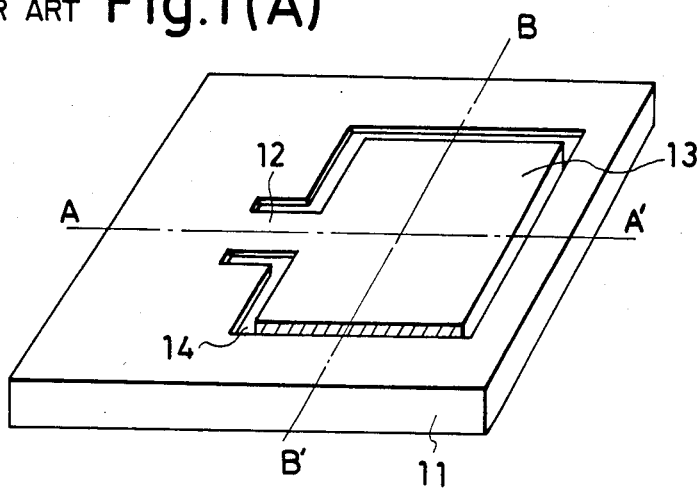
PRIOR ART Fig.1(B)
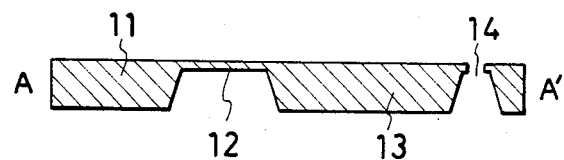
PRIOR ART Fig.1(C)
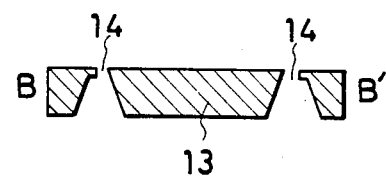

METHOD OF MANUFACTURE FOR SEMICONDUCTOR ACCELEROMETER

BACKGROUND OF THE INVENTION

1. Fields of the Invention

The present invention relates to a method for manufacturing a micro-miniature accelerometer which uses a cantilevered beam formed on a semiconductor substrate.

2. Prior Art

Recently, there has been developed a micro-miniature accelerometer which is formed on a semiconductor substrate.

Such a semiconductor accelerometer is formed on a semiconductor substrate using thin film technology such as etching. It is designed to detect the acceleration by sensing a resistance change due to the piezoresistance effect of a semiconductor or a minute capacity change due to deflection of a cantilevered beam.

Since such a semiconductor accelerometer is formed using thin film technology, as mentioned above, it has the excellent feature that it can be formed extremely small in size, for instance, with a length on the order on the 100 μm, a thickness of order of 1 μm, of the vibrating portion, and an overall chip size on the order on the 1 mm square, and in addition, that it can be formed on the same substrate for integrated circuit with other elements.

One such semiconductor accelerometer is described, for instance in "A Batch-Fabricated Silicon Accelerometer, IEEE Electron Devices", Vol. ED-26, No. 12, Dec. 1979, p. 1911.

The described conventional fabricating method is inconvenience to manufacturing accelerometers with high precision because the thickness of the cantilevered beams is controlled by regulating the temperature and the duration for etching.

SUMMARY OF THE INVENTION

An object of the invention is to provide a method of manufacturing a semiconductor accelerometer with high precision.

Another object of the invention is to provide a method of manufacturing a semiconductor accelerometer without a strict controlling on the temperature of an etching solution and the duration for etching.

Further object of the invention is to provide a method of manufacturing a semiconductor accelerometer in which an upper weight to improve the characteristics of the accelerometer can be easily formed on top of a cantilevered beam of the accelerometer without damaging the cantilevered beam.

In order to accomplish the above objects, the present invention is arranged to form the portion which is to becomes the cantilevered Si beam (including the Si weight) as a second conduction type (n-type, for instance), encompass its rim with a first conduction type (p-type, for instance), and by etching the portion of the first conducton type alone with the electrochemical etching that does not proceed beyond the p-n junction section, to form the support section of the cantilevered beam, that is of semiconductor of the first conduction type, with semiconductor of the second conduction type.

BRIEF DESCRIPTION OF THE DRAWINGS

These and other objects, features and advantages of the present invention will be more apparent from the following description of a preferred embodiment, taken in conjunction with the accompanying drawings, in which:

FIGS. 1(A) through 1(C) show a perspective view and a cross section view of a prior art device.

DESCRIPTION OF THE PREFERRED EMBODIMENTS

To facilitate the understanding of the present invention, a brief reference will be made to a prior art illustrations showing a perspective view and cross-section views of the semiconductor accelerometer mentioned in the above.

In FIGS. 1(A) through 1(C), an n-type Si substrate 11, a cantilevered Si beam 12, a Si weight 13, and an air gap 14 are shown.

When an acceleration is applied to a semiconductor accelerometer shown in FIGS. 1(A) through 1(B), the Si weight 13 is deflected, causing a distortion in the cantilevered Si beam 12.

Near the support section of the cantilevered Si beam 12 there is formed a diffused resistor which is not shown, and the resistance value of the diffused resistor changes by the piezoresistance effect when a distortion is created in the cantilevered beam.

Then, by detecting the change in the resistance value it becomes possible to detect the acceleration applied.

Referring to FIGS. 2(A) through 2(E), the manufacturing process for such a semiconductor accelerometer will be described.

Figure 2A:
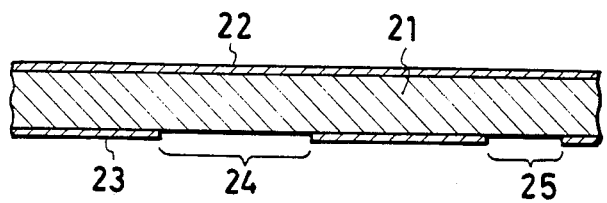
FIGS. 2(A) through 2(E) are views showing the manufacturing process for the prior art device.

In FIG. 2(A), in the first step, following the formation of a diffused resistor which is not shown on the n-type Si substrate 21, both of the top and bottom surfaces are coated with thermal oxide films (SiO$_2$). In the figure, 22 is the top surface thermal oxide film while 23 is the bottom surface thermal oxide film.

From the bottom surface thermal oxide film the cavity section 24 for the cantilevered beam and the cavity section 25 for the lower air gap are removed by photoetching.

Figure 2B:
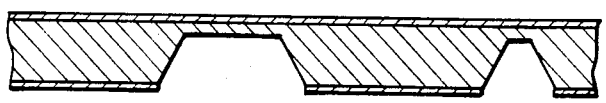

Next, in FIG. 2(B), etching of the Si substrate is carried out with the bottom surface thermal oxide film with the cavities as the mask.

For applying etching, anisotropic etching solution of KOH is used, and the thickness of the film for the portion for the cantilevered Si beam 27 is controlled by regulating the temperature of the etching solution and the duration for etching.

Figure 2C:
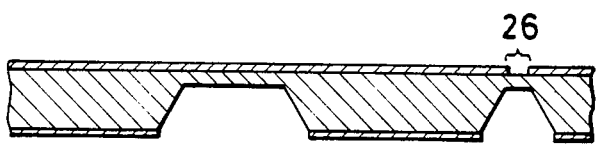

Then, in FIG. 2(C), the cavity 26 for the upper air gap is formed by photoetching on the top surface thermal oxide film 22.

Figure 2D:
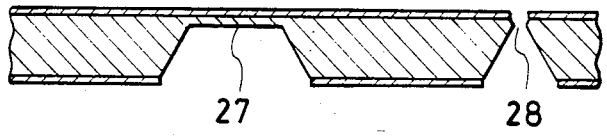

Next, in FIG. 2(D), a Si substrate 21 etching analogous to the step in FIG. 2(B) is carried out using the top surface thermal oxide film 22 with a cavity and the bottom surface thermal oxide film 23 with the cavities previously formed as the masks.

This etching is continued until there is formed an air gap 28.

Figure 2E:
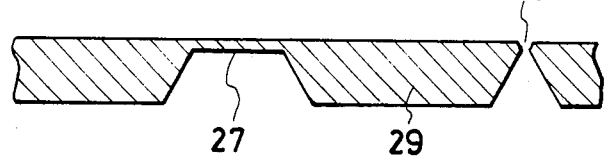

Then, in FIG. 2(E), both of the top surface thermal oxide film 22 and the bottom surface thermal oxide film 23 are removed.

As in the above, a cantilevered Si beam 27 and a Si weight 29, and also the air gap 28 that defines the external form of the cantilevered Si beam 27 and the Si weight 29, are formed.

As described in the above, in the prior art method of manufacturing a semiconductor accelerometer, it was necessary to apply Si etching twice in forming the cantilevered beam, once from the top surface and once from the bottom surface of the Si substrate. In particular, the necessity to give a Si etching from the top surface gave rise to a problem that limitations are imposed on the manufacturing process and the structure of the cantilevered Si beam.

In addition, the film thickness of the cantilevered Si beam is determined as mentioned above by the temperature of the etching solution, the duration of the etching, and the stirring condition of the etching solution, factors that are difficult to control with high precision, so that it is difficult to set the film thickness accurately.

Moreover, as will be described in detail later by referring to FIGS. 6(A) and 6(B), when an upper weight is to be formed, by such method as plating, on the top surface of the Si weight in an attempt to improve the characteristics of the accelerometer, there arose a problem that the working on the upper weight is very difficult and also that it is not easy to increase the accuracy of the pattern.

Figure 3A:
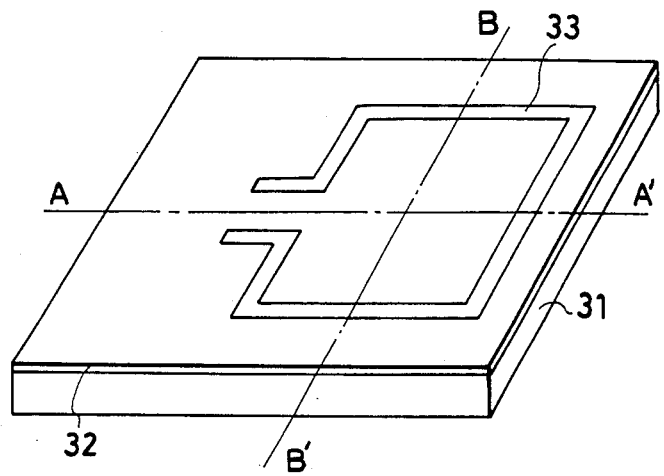
FIGS. 3(A) through 3(F) show perspective views and cross section views of an embodiment of the semiconductor accelerometer formed in accordance with the method of manufacture of the present invention.
Figure 3B:
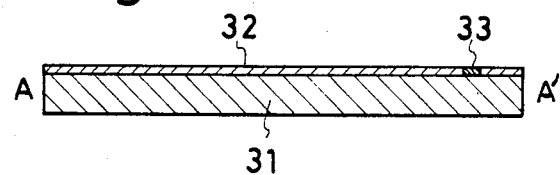
Figure 3C:
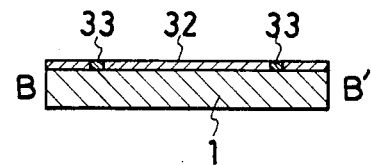
Figure 3D:
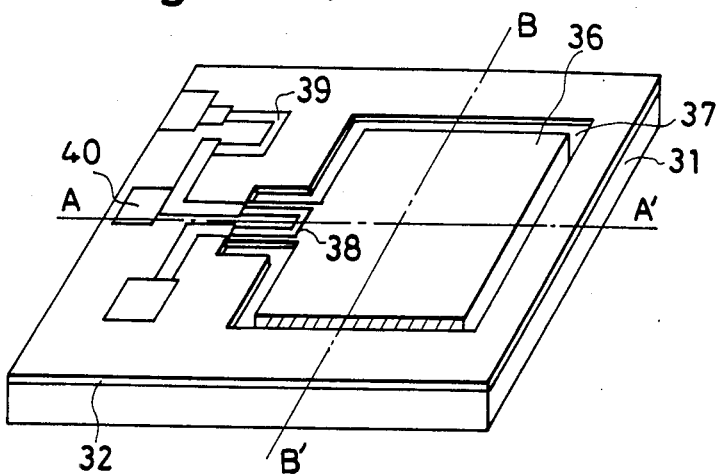
Figure 3E:
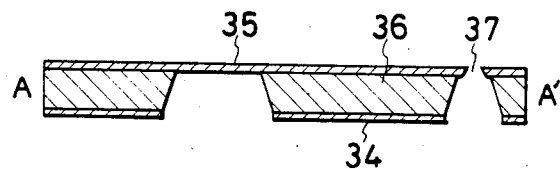
Figure 3F:
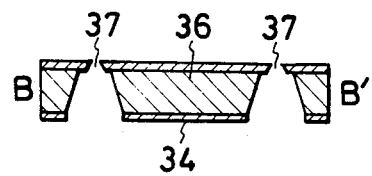

In FIGS. 3(A) through 3(F) are shown a perspective view and a cross section view of an embodiment of the semiconductor accelerometer manufactured in accordance with the present invention, in which FIGS. 3(A) through 3(C) illustrate the structure before etching, that is, before the formation of a cantilevered Si beam while FIGS. 3(D) through 3(F) illustrate the structure after etching, that is, after the formation of the cantilevered Si beam.

To begin, in FIGS. 3(A) through 3(C) an n-type Si layer 32 is formed on a p-type Si substrate 31.

The thickness of the Si layer 32 is set to be identical to the thickness of the cantilevered Si beam.

Next, a belt-like p-type Si region 33 is formed in the Si layer 32 to define the forms of the cantilevered Si beam and the Si weight.

The Si region 33 is formed from the surface of the Si layer 12 until it reaches the Si substrate 31.

After forming a strain detecting circuit on the substrate, the p-type portions, namely, the Si substrate 31 and the Si region 33, are etched using a suitable mask 34 (resist, SiO$_2$, Si$_3$N$_4$, or the like) on the back surface of the Si substrate 31, to obtain the state as in FIGS. 3(D) through 3(F). The strain detecting circuit comprises piezo-resistances 38, 39 which are arranged in series and applied with a suitable voltage therebetween, and an output electrode 40, functioning as strain detecting means.

The method of etching in the above will be described later.

In the state in FIGS. 3(D) through 3(F), the p-type portions, namely, the Si substrate 31 and the Si region 33, are removed in one operation by the Si etching with the mask that is provided on the back surface of the substrate 31.

As a result, there are formed a cantilevered Si beam 35, a Si weight 36, and an air gap 37 that surrounds the cantilevered beam and the weight.

Next, in FIGS. 4(A) through 4(G) is shown the manufacturing process according to the present invention.

Figure 4A:
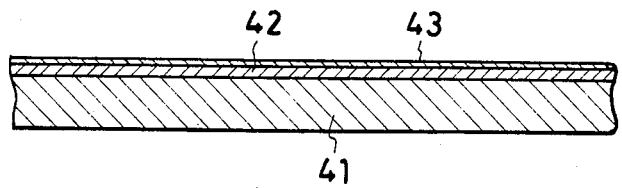
FIGS. 4(A) through 4(G) are views showing an embodiment of the manufacturing process in accordance with the present invention.

Referring to FIG. 4(A), an n-type Si layer 42 is formed on a p-type Si substrate 41.

As the Si layer 42, an epitaxial layer may be used, but an n-type impurity diffused layer will also work.

Then, an upper insulating film 43 is formed on the Si layer 42.

As the upper insulating film 43 may be, a thermal oxide film (SiO$_2$), but a phospho-silicate glass (PSG) film, an Si$_3$N$_4$ film, or the like will do also.

Figure 4B:

Next, in FIG. 4(B), a p-type Si region 44 is formed in the n-type Si layer 42 by impurity diffusion, followed by forming of a strain detecting circuit not shown in FIG. 4(B), but same as that in FIG. 3(B).

The Si region 44 which is the portion that is to become the air gap that determines the external form of the cantilevered beam and the weight, has to be diffused deep from the surface of the Si layer 42 until it reaches the Si substrate 41.

Figure 4C:
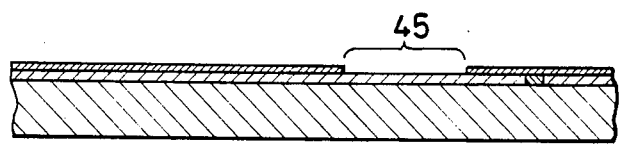

Next, in FIG. 4(C), a part of the upper insulating film 43 is removed in order to form a contact section 45 for applying voltage to the Si layer 42 in carrying out the electrochemical etching.

Figure 4D:
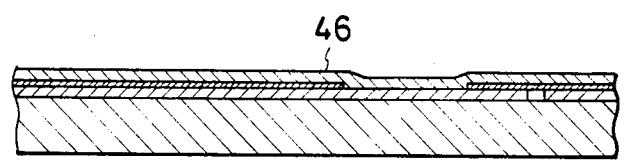

Next, in FIG. 4(D), a metallic (aluminum or others) film is formed on the entire top surface to create an electrode 46.

Here, in case the n-type impurity concentration of the Si layer 42 is insufficient for taking the ohmic contact between the Si layer 42 and the electrode 46, it will become necessary to form beforehand a high concentration n-type region at the area for the contact section 45 on the Si layer 42 surface.

Figure 4E:
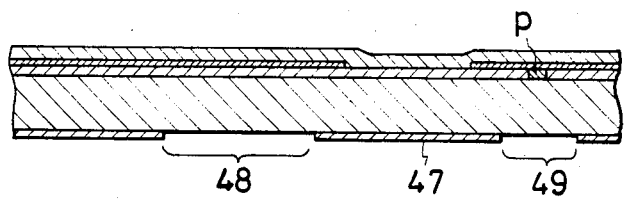

Next, in FIG. 4(E), portions, namely, the opening section 48 for the cantilevered beam and the drilling section 49 for the air gap, of the lower insulating film that is formed on the back surface of the Si substrate 41 are removed by photoetching to form a mask for the back surface etching.

Figure 4F:
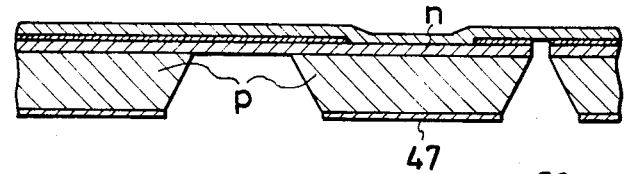

Next, in FIG. 4(F), an electrochemical etching is given from the back surface of the Si substrate 41 using the mask 47 on which are drilled holes.

The electrochemical etching will be described in detail later by referring to FIG. 5.

In the electrochemical etching, the n-type Si layer 42 alone is protected by the voltage to increase the resistivity to the etching so that the etching proceeds only in the areas of the p-type Si substrate 41 and Si region 44, until it is halted at the p-n junction surface which is the boundary between 41, 44 and 42.

Subsequent to the completion of the above Si etching, the upper insulating film 43 which is above the air gap 52 is removed by carrying out an etching from the back surface.

Figure 4G:
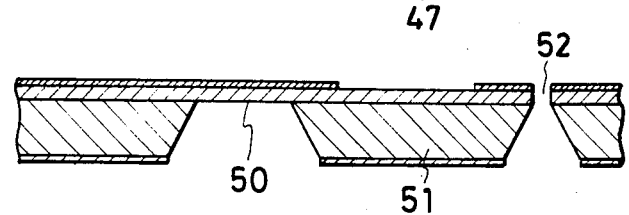

Next, in FIG. 4(G), by removing the electrode 46 which was formed on the entire top surface by etching, there are formed a cantilevered Si beam 50, a Si weight 51, and an air gap 52 which determines their external forms.

Next, by referring to FIG. 5, the electrochemical etching method will be described.

Figure 5:
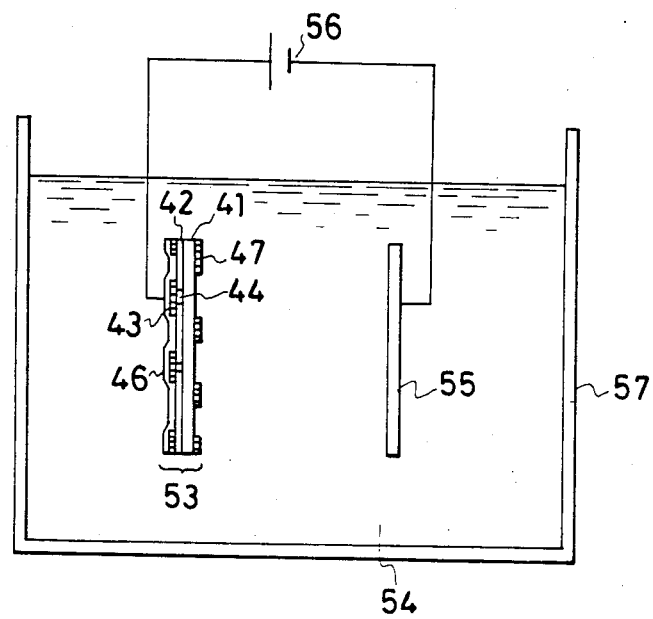
FIG. 5 is an explanatory diagram for electrochemical etching.

In FIG. 5, a Si wafer 53 and a cathode 55 (Pt or other metal is used in general) are immersed in a Si etching solution 54 in an etching bath 57.

Further, a voltage of order of 0.6 V from the power supply 56 is applied between the electrode 46 on the surface of the Si wafer 53 and the cathode 55.

The positive voltage which is given by the power supply 56 through the electrode 46 is applied only to the n-type Si layer 42 so that the Si layer 42 alone is protected by the voltage and increases the resistivity against the etching.

Because of this, the etching proceeds in the areas of the Si substrate 41 and the Si region 44 which are of p-type, but it is halted at the p-n junction surface which is the boundary between 41, 44 and 42.

As the etching solution to be used for the electrochemical etching, use is made of the etching solution, for example, of ethylene diamine series (with mixing ratio of 75 ml of ethylene diamine, 12 mg of pyrocaracole, and 24 ml of water) or strong alkali solution such as the KOH etching solution.

In the event the electrode 46 is eroded by the etching solution, it will become necessary to give a coating of an appropriate film on the surface of the electrode 46.

As may be clear from the structure shown by FIGS. 3(A) and 3(B) and the manufacturing process described in FIGS. 4(A) through 4(G) and FIG. 5, it is possible in the present invention to form a cantilevered Si beam 35, a Si weight 36, and an air gap 37 by one Si etching from the back surface. Moreover, since the film thickness of the cantilevered Si beam 35 is determined by the thickness of the Si layer 32 which is set initially, it is affected little by the temperature of the etching solution, the duration of etching, the stirring condition of the etching solution, and other conditions. Therefore, it becomes possible to set the film thickness of the cantilevered Si beam 35 with high precision.

Furthermore, the following advantage can be obtained according to the present invention.

Figure 6A:
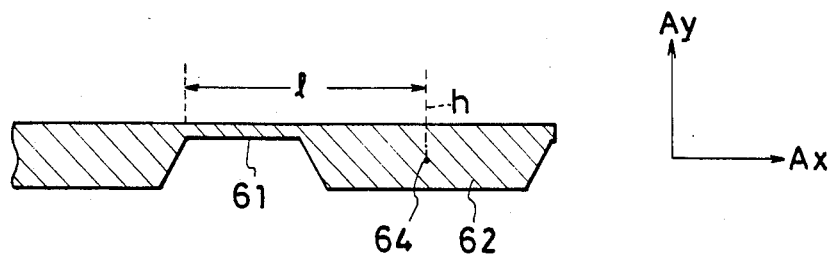
FIGS. 6(A) and 6(B) are cross section views of the prior art device and of a modification to it.

FIG. 6(A) is a cross section view of the structure which was described in the foregoing as the prior art example and an embodiment according to the present invention. An accelerometer of this construction, however, has the following problem.

Namely, in the above accelerometer, when an acceleration Ay is applied in the y direction (up and down direction of the figure), the acceleration is detected due to the deflection of the Si weight 62 in the y direction.

Therefore, it is desirable that the Si weight 62 will not be deflected when an acceleration in other direction. (x or z direction) is applied.

However, in the structure of FIG. 6(A), the center of gravity 64 of the Si weight 62 is located at a distance h below the position of the cantilevered Si beam 61 since the weight is formed beneath the cantilevered Si beam 61.

Denoting the sensitivity to acceleration in the y direction by Sy, the sensitivity to acceleration in the x direction is given by $$Sx = h/l \cdot Sy.$$

In the above equation, l is the distance from the supported end of the cantilevered Si beam 61 to the center of the Si weight 62.

In one sets l=1 mm and h=100 μm, then one obtains $$Sx = 0.1 \, Sy$$

That is, when an acceleration A is applied in the x direction it will give rise to an equivalent effect in which an acceleration of 0.1A is applied in the y direction.

Figure 6B:
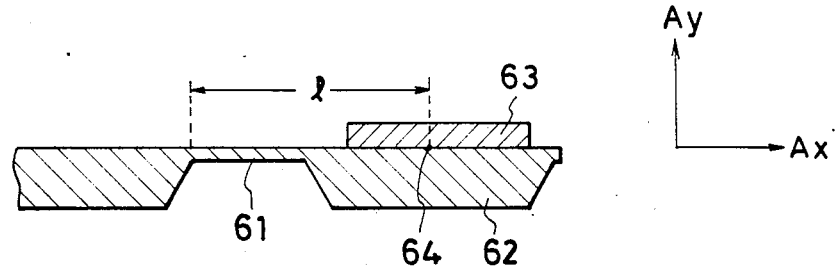

Therefore, in order to minimize the acceleration sensitivity in the x direction, it becomes necessary, as shown by FIG. 6(B), to reduce h, the positional deviation of the center of gravity 64, by providing an upper weight 63 on top of the Si weight 62.

As a method of forming an upper weight 63, use can be made of plating or bonding. However, considering that such a formation be made at low cost (that is, to give it a wafer processing) and be accomplished without damaging the cantilevered Si beam 61, it is necessary to form the upper weight prior to the formation of the cantilevered Si beam 61 and the Si weight 62.

However, in the prior art example shown in FIG. 2, there are required a photoetching process to the Si surface as shown by FIG. 2(C) and a Si etching process as shown by FIG. 2(D).

The upper weight 63 has a thickness in the range of several tens of micrometers to several hundreds of micrometers causing a somewhat large gap between a mask and the substrate so that it is very difficult to photoetch the surface after formation of the upper weight 63, and it is also difficult to improve the pattern precision. In addition the upper weight 63 tend to be an obstacle to forming an uniform mask.

In contrast to the above, according to the present invention, it is arranged that the Si etching is carried out only from the back surface, as shown by FIG. 4, so that there will arise no difficulty if the upper weight 63 is to be formed during the processes represented by FIGS. 4(D) and 4(E).

For instance, the upper weight 63 may be formed by leaving a necessary portion of the electrode 46.

Figure 7A:
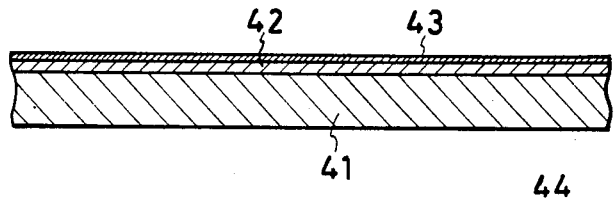
FIGS. 7(A) through 7(H) show perspective views and cross section views of another embodiment of the semiconductor accelerometer formed in accordance with the method of manufacture of the present invention.
Figure 7B:
Figure 7C:
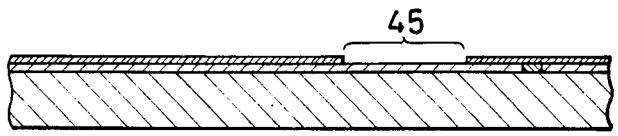
Figure 7D:
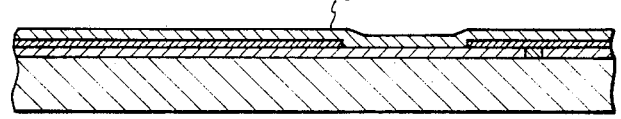
Figure 7E:
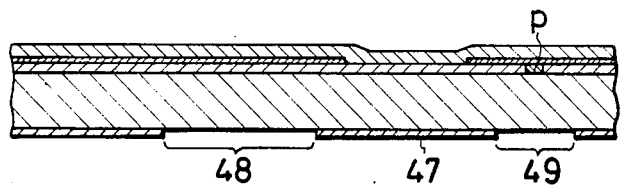
Figure 7F:
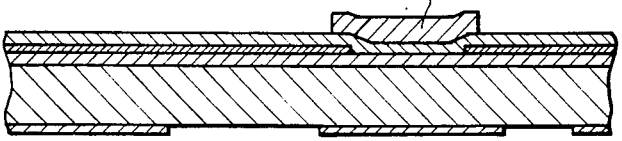

Next, another embodiment of the invention for the device as shown in FIG. 6(B) will be described below referring to FIGS. 7(A) through 7(H). In this process steps shown in FIGS. 7(A) through 7(E) are same as in FIGS. 4(A) through 4(E), so explanation is dispensed with. After the steps shown in FIGS. 7(A) through 7(E), an upper weight 63 is depositted on the substrate to be a main weight as shown in FIG. 7(F).

Figure 7G:
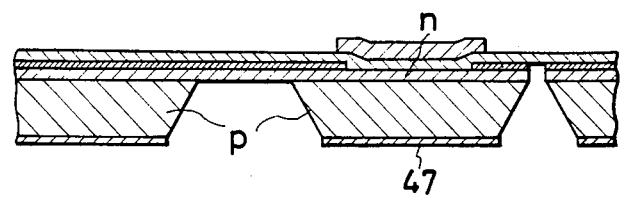
Figure 7H:
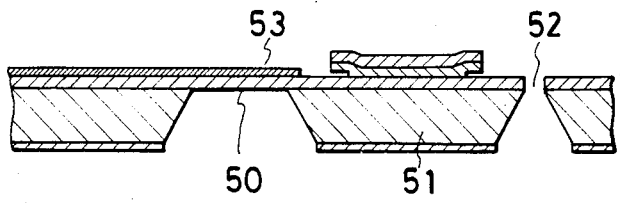

Next, in FIG. 7(G), an electrochemical etching is given from the back surface of the Si substrate 41 using the mask 47 on which are drilled holes in a condition that a voltage of order of 0.6 V is applied between the electrode 46 on the surface of the Si wafer 53 and the cathode 55.

Subsequent to the completion of the above Si etching, the upper insulating film 43 which is above the air gap 52 is removed by carrying out an etching from the back surface.

Next, in FIG. 7(G), by removing the electrode 46 which was formed on the entire top surface by etching, there are formed a cantilevered Si beam 50, a Si weight 51, and an air gap 52 which determines their external forms.

It should be noted that although the foregoing description has been made in conjunction with the structure in which a cantilevered Si beam of an n-type Si layer is formed on a p-type Si substrate, the roles of the p-type and the n-type can be interchanged without any difficulty.

Furthermore, although the description has been made in conjunction with the structure in which there is formed an Si weight, a similar description would also apply even in the case where there is not such an Si weight formed.

Various modifications will become possible for those skilled in the art after receiving the teachings of the present disclosure without departing from the scope thereof.

What is claimed is:

1. A method of manufacture for a semiconductor accelerometer with a cantilevered beam comprising:
    a step of providing an upper semiconductor layer of a first conductivity type on a semiconductor substrate of a second conductivity type opposite to the first conductivity type:
    a step of providing an electrode in ohmic contact with the upper layer;
    a step of forming a patterned region of the second conductivity type encompassing the external shape of a region to be the cantilevered beam in the upper layer;
    a step of forming a strain detecting means on the substrate;
    a step of providing a mask on the lower surface of the semiconductor substrate;
    a step of immersing the substrate with a cathode into etching solution in a condition that a voltage is applied between the electrode and the cathode to carry out an electrochemical etching such that the semiconductor substrate is etched to form the cantilevered beam.

2. A method of claim 1, wherein, said substrate is made of silicon.

3. A method of claim 2, wherein, said upper layer is an epitaxial layer.

4. A method of claim 2, wherein, the etching solution is ethylene diamine.

5. A method of claim 2, wherein, the etching solution is a strong alkali solution.

6. A method of claim 2, wherein, prior to the electrochemical etching an upper weight is formed on the upper surface of the region to be the cantilevered beam.

7. A method for manufacturing a semiconductor accelerometer comprising the steps of:
    forming a semiconductor layer of a first conductivity type on the surface of a semiconductor substrate of a second conductivity type;
    forming in the semiconductor layer a pattern region of the second conductivity type contacting the semiconductor substrate, said pattern region being patterned so as to define the outlines of a cantilever beam composed of the semiconductor layer and a weight composed of the semiconductor substrate connected to one end of the cantilever beam;
    forming a pattern mask on the back surface of the semiconductor substrate;
    etching by an alkali etching solution the semiconductor substrate and said pattern region from the back surface of the semiconductor substrate using said pattern mask as an etching mask; and
    applying voltage to the semiconductor layer such that the semiconductor layer is not etched with respect to a cathode electrode immersed in the alkali etching solution during said etching, said pattern mask being patterned so as to etch said pattern region, a semiconductor substrate portion below the pattern region and a semiconductor substrate portion below the cantilever beam.

8. A manufacturing method as claimed in claim 7, wherein the semiconductor substrate, the semiconductor layer and the pattern region comprise silicon.

9. A manufacturing method as claimed in claim 7, wherein an additional weight is formed on said cantilever beam before said etching.

* * * * *